United States Patent
Chen et al.

(10) Patent No.: US 12,251,862 B2
(45) Date of Patent: Mar. 18, 2025

(54) METAL-RESIN COMPOSITE, SURFACE TREATMENT METHOD, AND SUBSTRATE OF CIRCUIT BOARD FOR HIGH-FREQUENCY AND HIGH-SPEED SIGNAL TRANSMISSION

(71) Applicants: NANJING UNIVERSITY, Nanjing (CN); JIANGSU HHCK ADVANCED MATERIALS CO., LTD., Lianyungang (CN)

(72) Inventors: Wei Chen, Nanjing (CN); Qi Xue, Nanjing (CN); Huijie Zhuang, Nanjing (CN); Linling Li, Nanjing (CN); Jianglong Han, Nanjing (CN); Dongshan Zhou, Nanjing (CN); Xiaoliang Wang, Nanjing (CN)

(73) Assignees: NANJING UNIVERSITY, Nanjing (CN); JIANGSU HHCK ADVANCED MATERIALS CO., LTD., Lianyungang (CN)

( * ) Notice: Subject to any disclaimer, the term of this patent is extended or adjusted under 35 U.S.C. 154(b) by 0 days.

(21) Appl. No.: 18/632,326

(22) Filed: Apr. 11, 2024

(65) Prior Publication Data
US 2024/0342968 A1  Oct. 17, 2024

(30) Foreign Application Priority Data
Apr. 12, 2023 (CN) .......................... 202310389043.2

(51) Int. Cl.
*B32B 15/20* (2006.01)
*B29C 35/16* (2006.01)
(Continued)

(52) U.S. Cl.
CPC ........ *B29C 45/14311* (2013.01); *B29C 35/16* (2013.01); *C25D 11/02* (2013.01);
(Continued)

(58) Field of Classification Search
CPC .......... C25D 11/24; C25D 11/12; C25D 11/16; C25F 3/20
See application file for complete search history.

(56) References Cited

U.S. PATENT DOCUMENTS

2006/0055084 A1* 3/2006 Yamaguchi ............ C25D 11/18
264/274
2011/0310182 A1 12/2011 Mardilovich et al.
(Continued)

FOREIGN PATENT DOCUMENTS

CN  106217754 A  12/2016
JP  2003025298 A  1/2003
(Continued)

OTHER PUBLICATIONS

Wang et al., "One-Step Fabrication of Copper Nanopillar Array-Filled AAO Films by Pulse Electrodeposition for Anisotropic Thermal Conductive Interconnectors", 2019, ACS Omega, vol. 4, p. 6092-6096. (Year: 2019).*
(Continued)

*Primary Examiner* — Kim S. Horger
(74) *Attorney, Agent, or Firm* — Bayramoglu Law Offices LLC

(57) ABSTRACT

A metal-resin composite, a surface treatment method, and a substrate of a printed circuit board (PCB) for high-frequency and high-speed signal transmission comprise a surface-treated metal, and the surface-treated metal includes a nano-scale pore array that is used for filling of a resin and vertically extends from a surface to an interior of a metal, where nano-scale pillars are provided to extend from bottoms to openings of nano-scale pores of the nano-scale pore array. The pillar-in-pore structure makes a resin entering a nano-scale pore have an ultra-high anchoring effect on a resin body outside the nano-scale pore. Therefore, on the premise of not using an additive such as a T liquid or a
(Continued)

coupling agent, the present disclosure greatly improves a tensile bonding strength at an interface between a resin body and a metal substrate, and also eliminates a decline in an interfacial bonding strength of a composite.

8 Claims, 5 Drawing Sheets

(51) Int. Cl.
| | |
|---|---|
| *B29C 45/14* | (2006.01) |
| *C25D 11/02* | (2006.01) |
| *H05K 1/02* | (2006.01) |
| *H05K 1/03* | (2006.01) |
| *B29C 45/73* | (2006.01) |
| *B29K 33/00* | (2006.01) |
| *B29K 81/00* | (2006.01) |
| *B29L 31/34* | (2006.01) |

(52) U.S. Cl.
CPC ......... *H05K 1/0237* (2013.01); *H05K 1/0353* (2013.01); *B29C 2035/165* (2013.01); *B29C 2045/14868* (2013.01); *B29C 45/73* (2013.01); *B29K 2033/12* (2013.01); *B29K 2081/04* (2013.01); *B29L 2031/3425* (2013.01)

(56) References Cited

U.S. PATENT DOCUMENTS

| | | |
|---|---|---|
| 2013/0192992 A1 | 8/2013 | Mardilovich et al. |
| 2016/0194779 A1* | 7/2016 | Umemoto ............ B29C 70/683 |
| | | 428/307.3 |
| 2016/0310718 A1 | 10/2016 | Jin et al. |
| 2019/0389146 A1* | 12/2019 | Hiwatashi ................ B32B 7/04 |

FOREIGN PATENT DOCUMENTS

| | | |
|---|---|---|
| JP | 2003342791 A | 12/2003 |
| JP | 2006322044 A | 11/2006 |
| JP | 2016112796 A | 6/2016 |
| KR | 20170136838 A | 12/2017 |
| WO | 2021029645 A1 | 2/2021 |

OTHER PUBLICATIONS

GB/T 2423.22-2012/IEC 60068-2-14:2009, Environment testing-Part: Test methods-Test N: Change of temperature, China National Standards, 2012, pp. 1-10, General Administration of Quality Supervision, Inspection and Quarantine of the People's Republic of China China National Standardization Administration Committee.

* cited by examiner

METAL-RESIN COMPOSITE, SURFACE TREATMENT METHOD, AND SUBSTRATE OF CIRCUIT BOARD FOR HIGH-FREQUENCY AND HIGH-SPEED SIGNAL TRANSMISSION

CROSS REFERENCE TO RELATED APPLICATIONS

This application is based upon and claims foreign priority to Chinese Patent Application No. CN202310389043.2, filed on Apr. 12, 2023, the entire contents of which are incorporated herein by reference.

TECHNICAL FIELD

The present disclosure relates to a metal and a surface treatment method thereof, and also relates to a composite of a surface-treated metal and a resin, and a manufacturing method thereof. In addition, the present disclosure relates to a use of the composite in a substrate of a printed circuit board (PCB) for high-frequency and high-speed signal transmission.

BACKGROUND

In actual production, it is often necessary to deal with metal-resin bonding. Traditionally, a metal and a resin are bonded through a chemical binder or a large number of rivets, undercuts, and screws-nuts. The traditional methods face a large number of problems that are difficult to solve. For example, a binder has poor acid and alkali resistance, and thus a composite prepared with the binder cannot undergo subsequent surface treatment. The use of rivets or the like will not only complicate a technological process, but also make an obtained metal-resin composite have a large size and a low bonding strength. Therefore, in recent years, with the significant increase in the demand for miniaturization and functional integration of devices, composite materials produced by firmly bonding a resin and a metal with a nano-molding technology (NMT) have been more and more widely used in fields such as microelectronics, microelectromechanics, precision optics, microfluidics, communications, biomedicine, and transportation.

In NMT, a large number of nano-scale pores are first etched on the surface of a metal through chemical or electrochemical etching, and then a resin is directly injected to the surface of the metal and cooled to obtain a metal-resin composite product with a high interfacial bonding strength. However, in the existing NMTs for preparing metal-resin composites, the internal stress of the resin often leads to a significant decline in the interfacial bonding strength of the composite. Although the annealing treatment for the metal-resin composite can partially eliminate the internal stress of a resin, the annealing treatment has a limited impact on the interfacial bonding strength between the resin and a metal. Therefore, thermoplastic resins with high crystallinity and ultra-high crystallization rate, such as polyphenylene sulfide (PPS) and polybutylene terephthalate (PBT), are often used for nano-molding in the industry to reduce the impact of a residual internal stress in a resin as much as possible during processing. A product made of a conventional resin with low crystallinity, such as polymethyl methacrylate (PMMA), polycarbonate (PC), polypropylene (PP), or polyvinyl chloride (PVC), and a metal by NMT cannot be used as a composite due to a low interfacial bonding strength, which significantly limits an application range of NMTs.

Another serious problem faced by metal-resin composites is as follows: because a difference of a coefficient of linear thermal expansion between a resin and a metal can reach two orders of magnitude, an interfacial bonding strength between the metal and the resin often decreases greatly due to a high cooling rate of a composite during processing. A bonding strength of a metal-resin composite often continues to decrease with the increase of a number of high/low temperature cycles in an operating environment. In the field of signal transmission, especially in the 6G field with terahertz-scale signal frequencies, a small number of water molecules produced through a condensation of a binder, various small-molecule additives, and a coupling agent left on a surface of a metal will inevitably cause an increase in an interfacial dielectric coefficient and reduce the reliability of a metal-resin composite substrate, such as a failure of an anodic conductive wire of PCB or delamination of PCB. In addition, in order to ensure the integrity of high-frequency signal transmission, a metal with an ultra-low surface roughness is required, but a low surface roughness will lead to a decline of interfacial bonding performance between a metal and a resin. A contradictory relationship between a structure and required performance encountered in the development of circuit boards for high-frequency and high-speed signal transmission has become an urgent problem to be solved.

SUMMARY

A first objective of the present disclosure is to provide a surface-treated metal, where pores formed in the metal are conducive to enhancing a bonding strength of the metal to a resin.

A second objective of the present disclosure is to provide a surface treatment method for the surface-treated metal.

A third objective of the present disclosure is to provide a metal-resin composite produced by bonding the metal with a resin.

A fourth objective of the present disclosure is to provide a manufacturing method of the metal-resin composite.

A fifth objective of the present disclosure is to provide a use of the metal-resin composite in a substrate of a PCB.

The surface-treated metal of the present disclosure includes a nano-scale pore array that is used for filling of a resin and extends from a surface to an interior of a metal, where nano-scale pillars are provided to extend from bottoms to openings of some or all of nano-scale pores of the nano-scale pore array.

An included angle between a central axis of each of the nano-scale pores and the surface of the metal is 60° to 90°, preferably 70° to 90°, and more preferably 80° to 90°.

An included angle between each of the nano-scale pillars and a central axis of a corresponding nano-scale pore is 0° to 30°, preferably 0° to 20°, and more preferably 0° to 10°.

The nano-scale pillars have a same chemical composition as walls of the nano-scale pores.

The surface of the surface-treated metal is full of nano-scale pores with nano-scale pillars ("pillar-in-pore"), and has a porosity of 0.1 to 0.9.

The nano-scale pores each have a diameter of 20 nm to 1 µm and preferably 50 nm to 200 nm, and a depth of 20 nm to 10 µm and preferably 100 nm to 2 µm.

The nano-scale pillars each have a diameter of 10 nm to 950 nm and preferably 20 nm to 150 nm, and a length of 10 nm to 9.9 µm and preferably 30 nm to 1.5 µm. A diameter ratio of the nano-scale pillars to corresponding nano-scale pores is 0.1 to 0.9, a ratio of the length of the nano-scale pillars to the depth of the corresponding nano-scale pores is 0.15 to 0.95, and nano-scale pores with the nano-scale pillars account for 10% to 100% and preferably 30% to 90% of all the nano-scale pores on the surface of the surface-treated metal.

The present disclosure provides a manufacturing method of the surface-treated metal, including the following steps:

S1: cleaning a surface of an original metal to obtain a first metal intermediate, and placing the first metal intermediate as a first anode in an electrolytic cell for polishing to obtain a second metal intermediate;

S2: placing the second metal intermediate as a second anode in a first acidic solution, and conducting anodic oxidation at a voltage of 10 V to 100 V and a temperature of −10° C. to 30° C. for 3 min to 300 min to obtain a third metal intermediate, where the first acidic solution includes 0.1 wt % to 25 wt % of one or more acids selected from a group consisting of sulfuric acid, phosphoric acid, oxalic acid, chromic acid, boric acid, benzoic acid, citric acid, and tartaric acid, and a solvent of the first acidic solution is pure water or a water-ethylene glycol mixed solvent including 0.1 wt % to 80 wt % of ethylene glycol;

S3: soaking the third metal intermediate in a second acidic solution 1 time to 20 times for 1 min to 90 min each time to allow pore expansion to obtain a fourth metal intermediate, where the second acidic solution includes 0.1 wt % to 25 wt % of one or more acids selected from the group consisting of sulfuric acid, phosphoric acid, oxalic acid, chromic acid, boric acid, benzoic acid, citric acid, and tartaric acid, and has a strong acidity, but exhibits a weak dissolution-oxidation ability for a metal oxide; a temperature of the second acidic solution is maintained at 0° C. to 100° C.; and a metal product obtained after the soaking each time is washed with water and then blow-dried with cold air; and S4: rinsing and oven-drying the fourth metal intermediate.

In the S1, a surface pretreatment is at least one selected from a group consisting of dewaxing, degreasing, activation, and cleaning. For example, the original metal is degreased and cleaned. The original metal is placed under ultrasonic waves in a solvent commonly used by those skilled in the art to remove oil stains on a surface of the original metal, and then placed under ultrasonic waves in the solvent to clean the surface of the original metal. The solvent is ethanol or acetone. The present disclosure does not have a special restriction on a metal substrate (such as an aluminum alloy substrate or an aluminum substrate) that needs to be pretreated, and the aluminum alloy substrate can be various aluminum alloys of industry standard series or a mold-casting grade. The aluminum alloy in the present disclosure can be aluminum alloys of various shapes and structures commonly used by those skilled in the art, and the various shapes and structures of the aluminum alloys can be allowed through machining.

In the S1, a metal that has undergone a conventional surface pretreatment is placed as the first anode in the electrolytic cell for the polishing, where an electrolyte is a mixed solution of perchloric acid and ethanol in a volume ratio of 1:(0.25-4), and electrolysis is conducted at a constant voltage of 10 V to 100 V for 1 min to 120 min.

After the S1 and before the S2, the manufacturing method further includes the following steps sequentially:

S2-0: placing the second metal intermediate as a third anode in a third acidic solution, and conducting anodic pre-oxidation at a voltage of 30 V to 80 V and a temperature of 0° C. to 50° C. for 10 min to 60 min to obtain a fifth metal intermediate, where the third acidic solution includes 0.1 wt % to 25 wt % of one or more acids selected from the group consisting of sulfuric acid, phosphoric acid, oxalic acid, chromic acid, boric acid, benzoic acid, citric acid, and tartaric acid, and a solvent of the third acidic solution is pure water or a water-ethylene glycol mixed solvent including 0.1 wt % to 80 wt % of ethylene glycol; and S2-1: soaking the fifth metal intermediate in a mixed acid solution 1 to 20 times for 1 min to 3 min each time to partially or completely remove a porous alumina layer formed after the anodic pre-oxidation, where the mixed acid solution includes 1 wt % to 10 wt % of chromic acid and 5 wt % to 60 wt % of phosphoric acid; a temperature of the mixed acid solution is maintained at 10° C. to 100° C.; and a metal product obtained after the soaking each time is washed with water and then blow-dried with cold air.

In the S2, preferably, a mass fraction of the one or more acids is 2 wt % to 10 wt %, and the anodic oxidation is conducted at a voltage of 10 V to 80 V and a temperature of −10° C. to 10° C. for 80 min to 120 min; and more preferably, the mass fraction of the one or more acids is 4 wt % to 7 wt %, and the anodic oxidation is conducted at a voltage of 40 V to 60 V and a temperature of 0° C. to 5° C. for 100 min to 120 min.

In the S2, if the voltage is lower than 10 V, it is impossible to form pores, and if the voltage is higher than 100 V, a metal sheet is easily penetrated.

The research of the present disclosure has shown that, in the S2, the concentration of the one or more acids, the voltage, the temperature, and the anodic oxidation time play a synergistic role, and especially, the voltage and the anodic oxidation time have a very important impact on a result. If the voltage is too low, it is impossible to form pores. If the voltage is too high, a metal sheet is easily penetrated. Therefore, the voltage needs to be controlled in the above range. The higher the voltage, the larger the size of pores formed and the larger the diameter of the nano-scale pillar. In addition, the longer the anodic oxidation time, the deeper the pores relatively and the longer the nano-scale pillar relatively. A current density for the anodic oxidation is less than 1.5 mA/cm$^2$. The metal of the present disclosure may be selected from a group consisting of aluminum, magnesium, copper, stainless steel, titanium, iron, zinc, and an alloy thereof.

For example, the metal of the present disclosure may be aluminum, copper, stainless steel, magnesium, iron, titanium, zinc, or an alloy including the same. More specifically, the alloy here refers to a material with a corresponding metal as a main component (a mass proportion of the main component is 20 wt % or more, 50 wt % or more, and preferably 80% or more). In addition, the metal material can further include a metallic or non-metallic element such as carbon, silicon, manganese, chromium, tungsten, molybdenum, phosphorus, titanium, vanadium, nickel, zirconium, or boron.

The metal-resin composite of the present disclosure includes a metal substrate and a resin that is located on a surface of the metal substrate and filled into pores of the metal substrate. The resin includes a single resin or a resin composition. Specifically, in the present disclosure, a wide range of resins can be adopted, such as thermoplastic resins or thermosetting resins. The resin of the present disclosure is not limited to the few resins with high crystallinity such as PPS and PBT disclosed in the art, but also includes general-purpose resins such as a polyester, polyethylene, PP, polystyrene, PVC, an epoxy resin, a polyamide (PA), a polyacetal, PC, a modified polyphenylene ether, a polyaryl compound, a polyetherimide, a polyamideimide, a fluorine-containing resin, a butyl resin, and a petroleum resin and a copolymer thereof.

The present disclosure also provides a manufacturing method of the metal-resin composite, including the following steps:

S1: pretreating a surface of a metal to form a nano-scale microporous structure for injection molding on the surface of and inside the metal to obtain the surface-treated metal;

S2: placing the surface-treated metal in a mold, setting a temperature of the mold to be higher than a glass transition temperature of the resin and lower than a melting temperature of the resin, and injecting the resin into the mold such that the resin is bonded with the surface-treated metal to produce an initial metal-resin composite, where a pressure-holding time is 5 s to 20 s; and S3: allowing the initial metal-resin composite in the mold to be rapidly cooled at a cooling rate of higher than 100° C./s from an original temperature to a final temperature 20° C. lower than the glass transition temperature of the resin, and demolding.

In the S3, the mold is subjected to programmed cooling such that the initial metal-resin composite is cooled at the cooling rate of higher than 100° C./s from the original temperature to the final temperature 20° C. lower than the glass transition temperature of the resin. Preferably, the cooling rate is increased to $10^{3}$° C./s or more. More preferably, the cooling rate is increased to $4*10^{3}$° C./s or more.

The metal-resin composite described above is achieved by constructing micropores and nanostructures in the micropores with a specific morphology, and any metal surface with such a structure can be used to improve a compounding effect of a metal with a resin. Therefore, such a composite structure can be used in manufacturing fields of parts of, for example, automobiles, household electrical appliances, and industrial machines. In addition, the metal-resin composite prepared by the present disclosure can be used in a PCB, and can allow the excellent bonding of a resin material with a copper foil. The specific metal-resin composite of the present disclosure can avoid the problem that a small number of water molecules produced through a condensation of a binder, various small-molecule additives, and a coupling agent left on the surface of the metal will cause an increase in an interfacial dielectric coefficient leading to interfere with the high-speed transmission of high-frequency signals, and thus improve the reliability of a metal-resin composite substrate.

The present disclosure can greatly improve an interfacial bonding strength of a resin body with a metal substrate without using an additive such as a T liquid and a coupling agent, and a principle is as follows: During an injection molding process, a temperature of a resin first drops from a temperature of a material barrel to a temperature of a mold, and then drops to an ambient temperature. When a cooling rate is too high, because a coefficient of linear thermal expansion of a resin is 1 to 2 orders of magnitude higher than a coefficient of linear thermal expansion of a metal oxide constituting a nano-scale pore, a resin entering the nano-scale pore undergoes isotropic centripetal contraction, such that an interfacial layer originally in close contact with a pore wall falls off from the pore wall, resulting in a decline of a macroscopic interfacial tensile bonding strength of a metal-resin composite. However, when there is a nano-scale pillar in the nano-scale pore, the centripetal contraction of the resin will cause the resin to tightly wrap the nano-scale pillar in the nano-scale pore, resulting in an increase of a macroscopic interfacial bonding strength of a metal-resin composite. That is, the nano-scale pillar in the nano-scale pore makes a resin entering the nano-scale pore have an ultra-high anchoring effect for a resin body located outside the nano-scale pore, which greatly improves an interfacial bonding strength between the resin body and a metal substrate. In addition, due to a specified temperature difference between a material barrel and a mold, a movement of a resin polymer chain first entering a nano-scale pore is inhibited, and a conformation of the resin polymer chain is partially fixed, resulting in a large residual internal stress. During an operating process, the release of an internal stress with a change of an ambient temperature is considered to be one of major factors causing a decline of a macroscopic interfacial bonding strength of a metal-resin composite. However, when there is a nano-scale pillar in a nano-scale pore, the release of a residual internal stress will be transformed into a wrapping force for a nano-scale pillar in a nano-scale pore, such that a macroscopic interfacial bonding strength of a metal-resin composite does not decrease with high-temperature/low-temperature cycles.

During the manufacturing, any method that can manufacture the nanostructure on a surface of the composite can achieve the objective of the present disclosure. For example, laser forming, surface plasma micro-nano structure forming, or the like can be adopted. Preferably, the anodic oxidation-pore expansion manner of the present disclosure can be adopted.

A mechanism and principle of formation of a nano-scale pore array on a surface of a metal in the present disclosure are as follows: With electrochemical anodic oxidation of the metal aluminum in an acidic solution as an example, $Al^{3+}$ is produced from the metal aluminum under an action of an electric field, continuously diffuses and migrates to a solution under the drive of a concentration gradient, and interacts with $OH^-$ and $O^{2-}$ ions in the solution to produce an aluminum hydroxide (or hydrated alumina) colloid. When the colloid grows up and can no longer be dispersed in the solution, the colloid will be deposited on a surface of the metal in the form of alumina or hydrated alumina to first form an extremely-thin dense alumina layer on the surface of the metal aluminum, and because the metal aluminum is oxidized into alumina, a distance among aluminum atoms increases significantly. That is, during the anodic oxidation, there is a volume expansion at an interface between a metal and an oxide layer, such that alumina preferentially grows along a direction perpendicular to the interface. Under the drive of a mechanical stress caused by the volume expansion, in order to ensure a minimum energy state of a system, alumina spontaneously enters a hexagonal dense packing state to finally form a nano-scale pore array.

A mechanism and principle of formation of a concave pore structure array with a nano-scale pillar on a surface of a metal are as follows: With electrochemical anodic oxidation of the metal aluminum as an example, both an oxidation reaction of the metal aluminum and oxidation reactions of hydroxide and oxygen anions occur at the anode:

$$Al - 3e^- \rightarrow Al^{3+} \text{ (a main reaction)};$$

$$4OH^- - 4e^- \rightarrow 2H_2O + O_2\uparrow \text{ (a side reaction); and}$$

$$2O^{2-} - 4e^- \rightarrow O_2\uparrow \text{ (a side reaction)}.$$

Since a half-potential $E(Al^{3+}/Al)=1.494$ V$>E(O/O^{2-})=1.228$ V, oxygen must be produced before trivalent aluminum ions are produced at the anode. When an alumina nano-scale pore is formed on the surface of the metal aluminum, due to a strongest electric field at a bottom of the nano-scale pore, normally, oxygen will quickly escape from the surface of the metal in the form of bubbles once produced at the bottom of the nano-scale pore. If a generation rate of the oxygen and an escape rate of the bubbles are accurately controlled, a residence time of the bubbles at the bottom of the nano-scale pore can be prolonged, and the bubbles can be fused into large bubbles and then escape out of the nano-scale pore. In addition, when the alumina nano-scale pores have a specified length-to-diameter ratio, freshly-produced aluminum hydroxide colloids grow up before diffusing and migrating outside a nano-scale pore, and thus is deposited at a bottom of the nano-scale pore. According to reports in the literature, an internal pressure of a bubble with a diameter of 50 nm can reach 160 MPa. Thus, under the squeezing of oxygen bubbles at a bottom of a nano-scale pore, alumina deposited in the nano-scale pore is squeezed to a center of the bottom of a nano-scale pore and grows towards an opening of the nano-scale pore, thereby forming a hollow center pillar.

Beneficial effects: Compared with the prior art, the present disclosure is conducive to the integrated compounding in an interface zone, and can significantly improve the interfacial properties of a metal-resin composite. Specifically, the present disclosure has the following advantages:

Without using an additive such as a T liquid and a silane coupling agent, the present disclosure can greatly improve an interfacial bonding strength between a resin body and a metal substrate. For example, a bonding force of PPS to aluminum in the metal-resin composite prepared in the present disclosure can be increased by 113%.

A wide range of resins are available for use in the present disclosure. The resin in the present disclosure is not limited to the few resins such as PPS and PBT disclosed in the art. When a metal-resin composite is prepared by the present disclosure, a bonding force of an amorphous resin such as PMMA, PC, or PVC to the metal aluminum can be increased by 2.5 times or more, which greatly broadens an application range of NMTs.

More critically, the present disclosure can solve the problem that a too-high cooling rate causes a decline of an interfacial bonding strength of a composite during a manufacturing process due to a huge difference in a coefficient of thermal expansion between a metal and a resin. Studies have shown that, when a cooling rate is higher than 1,000° C./s, a bonding strength of the metal-resin composite prepared by the present disclosure can be increased by nearly 90 times.

The present disclosure further solves the problem that a bonding strength of a metal-resin composite continues to decrease with high-temperature/low-temperature cycles in an operating environment. Studies have shown that, after a plurality of high-temperature/low-temperature tests are conducted according to GB/T 2423.22-2012, a change in a bonding strength of the metal-resin composite prepared in the present disclosure is less than 6%, but a change in a bonding strength of a composite prepared by the conventional nano-molding method as a contrast is greater than 40%, indicating that the present disclosure can greatly improve the stability of a bonding strength of a metal-resin composite.

The present disclosure innovatively adopts a "pillar in concave pore" array structure on a surface of a metal to allow the high-performance bonding of the metal with a resin without using an interfacial bonding agent or coupling agent. Because a compounding interface is formed between a metal and a resin without the use of a surface binder, a T liquid, or a siloxane coupling agent or the introduction of any polar functional group or any siloxane or silicon-hydroxyl functional group at the interface in the present disclosure, it avoids an increase in an interfacial dielectric coefficient. The present disclosure is of great significance for the development of substrates for high-frequency and high-speed signal transmission represented by 5G+. In the field of signal transmission, especially in the 6G field involving terahertz-scale signal frequencies, a small number of water molecules produced through a condensation of a binder, a small-molecule additive, and a coupling agent left on a surface of a metal will inevitably cause an increase in an interfacial dielectric coefficient and reduce the reliability of a metal-resin composite substrate (such as PCB), which may cause a failure of an anodic conductive wire or delamination. Because small-molecule additives such as a binder or a T liquid and a coupling agent are not used, the present disclosure can not only reduce a dielectric constant of a metal-resin composite, but also improve the reliability of a metal-resin composite substrate. In addition, the metal-resin composite prepared by the present disclosure has a super-strong (higher than 20 MPa) bonding strength and stability, and an ultra-low surface roughness (Rz<500 nm), which can guarantee the integrity of high-frequency signal transmission.

The present disclosure is not limited to the method of injection molding, and any method allowing the molding of a metal-resin composite can be adopted. The injection molding is conducted under the following conditions: a mold temperature: 30° C. to 250° C., a nozzle temperature: 200° C. to 400° C., a pressure-holding time: 1 s to 60 s, and an ejection pressure: 30 Mpa to 300 Mpa. 1 g to 100 g of the resin composition is generally injected, and a resin layer with a thickness of 0.5 mm to 10 mm is formed on a surface of a prepared composite.

The resin composition includes a host resin and a reinforcing material. Preferably, a mass percentage of the host resin in the resin composition is 50% to 90%, and a mass percentage of the reinforcing material in the resin composition is 10% to 50%. Preferably, the host resin includes at least one selected from the group consisting of PPS, PBT, PA, PMMA, PC, PP, PVC, and polyvinylidene fluoride (PVDF). The reinforcing material can be at least one selected from the group consisting of a glass fiber, a carbon fiber, an aramid, a glass sheet, calcium carbonate, magnesium carbonate, silicon dioxide, talc, and a clay. An amount of the resin in the present disclosure is not specifically limited, and can be determined according to a size of a mold and a size of a metal substrate, as long as a metal-resin composite can be produced from the metal substrate and the resin composition. Preferably, a volume ratio of the thermoplastic resin composition to the metal substrate can be 1:1.

The metal-resin composite prepared by the present disclosure can be used directly, and can also undergo a post-treatment subsequently according to needs, such as computer numerical control (CNC) machining and spraying.

DETAILED DESCRIPTION OF THE EMBODIMENTS

The present disclosure provides a surface-treated metal and a metal-resin composite made thereof. The surface-treated metal includes a nano-scale pore array that is used for filling of a resin and vertically extends from a surface to an interior of a metal, where nano-scale pillars are provided to extend from bottoms to openings of nano-scale pores of the nano-scale pore array. The nano-scale pillar has the same chemical composition as a wall of the nano-scale pore. The "pillar-in-pore" structure makes a resin entering a nano-scale pore have an ultra-high anchoring effect for a resin body outside the nano-scale pore. Therefore, on the premise of not using an additive such as a T liquid or a coupling agent, the present disclosure can not only greatly improve an interfacial bonding strength between a resin body and a metal substrate, but also eliminate a decline in an interfacial bonding strength of a composite caused by a large ambient temperature difference during manufacturing and use processes due to a large difference of a coefficient of thermal expansion between a metal and a resin, thereby significantly improving the stability of a bonding strength of a metal-resin composite. Thus, the present disclosure solves the problem that a bonding strength of a metal-resin composite often continues to decrease with the increase of a number of high/low temperature cycles. A wide range of resins are available in the present disclosure. The metal-resin composite prepared in the present disclosure has a high interfacial bonding tensile strength. The preparation method of the present disclosure is suitable for industrial production.

The technical solutions of the present disclosure are further described below with reference to the accompanying drawings.

Figure 1:
FIG. 1 is a schematic structural diagram of the metal-resin composite in the present disclosure, where 1 represents a surface-treated metal and 2 represents a resin.
Figure 2:
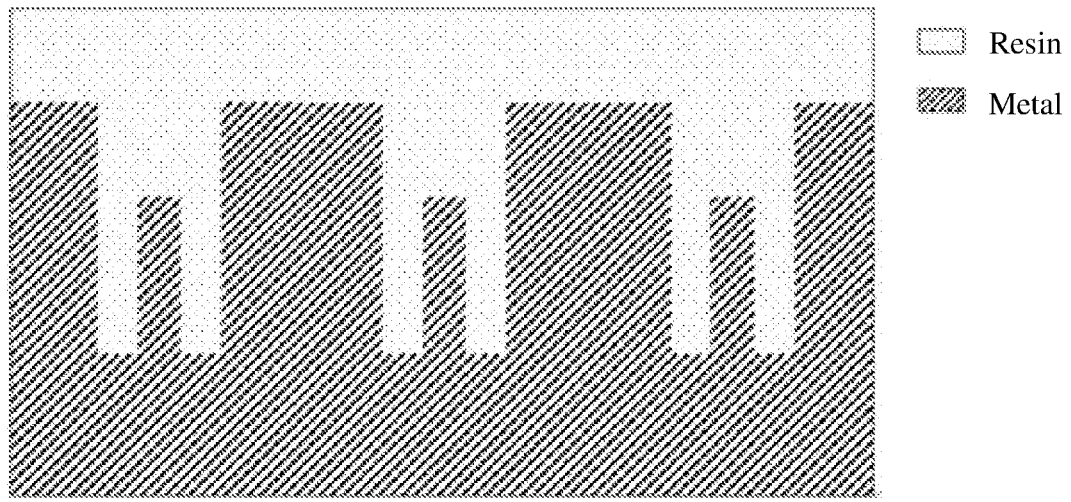
FIG. 2 is a schematic cross-sectional view of the metal-resin composite in the present disclosure.
Figure 3:
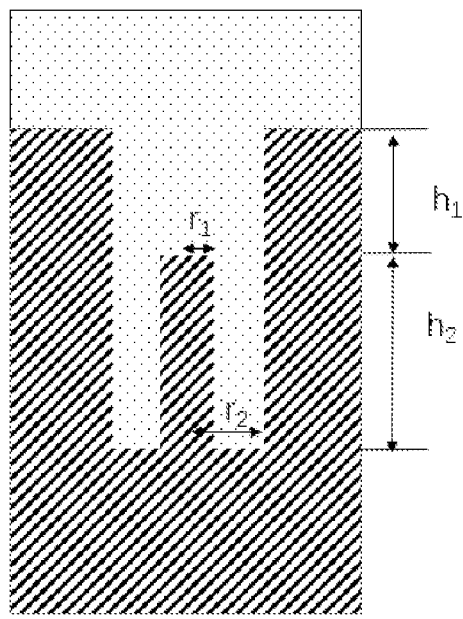
FIG. 3 is a schematic cross-sectional view of the metal-resin composite in the present disclosure, where structural parameters are marked.
Figure 4:
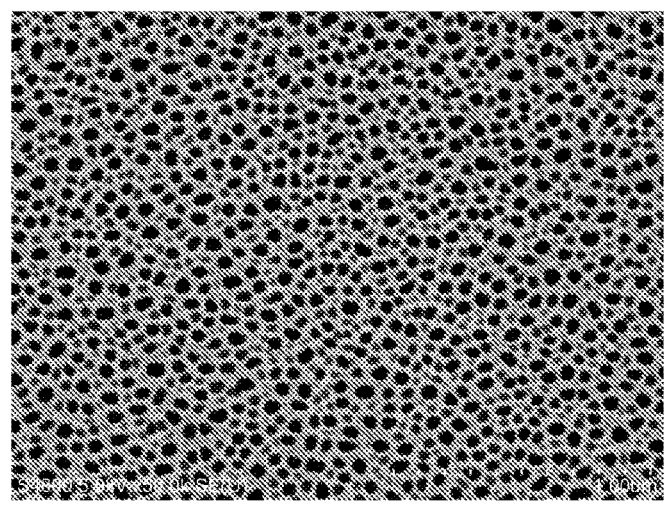
FIG. 4 is a scanning electron microscopy (SEM) image of a surface of the metal in Example 3.
Figure 5:
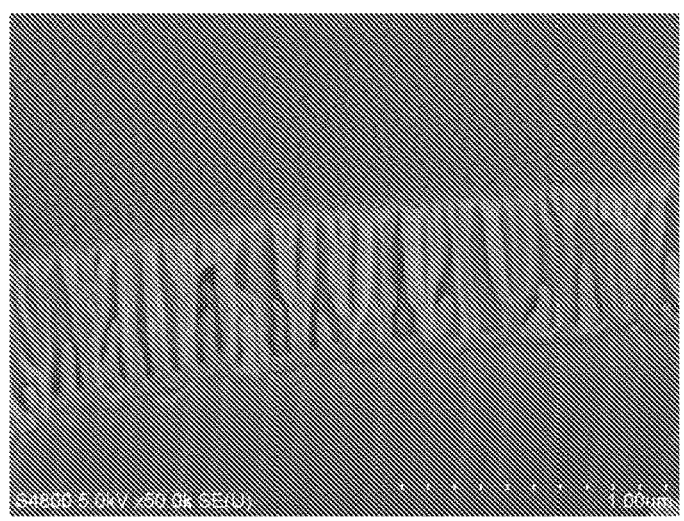
FIG. 5 is an SEM image of a cross-section of the metal in Example 3.

The metal-resin composite of the present disclosure includes a metal substrate and a resin composition that is located on a surface of the metal substrate and filled into pores of the metal substrate. Schematic structural diagrams of the metal-resin composite are shown in FIG. 1 and FIG. 2. The metal substrate of the present disclosure is fully covered by nano-scale pores with nano-scale pillars ("pillar-in-pore"), as shown in FIG. 3, and the metal substrate has a porosity of 0.1 to 0.9. The nano-scale pores each have a diameter $2r_2$ of 20 nm to 1 μm and preferably 50 nm to 200 nm and a depth $h_1+h_2$ of 20 nm to 10 μm and preferably 100 nm to 2 μm. A nano-scale pillar that coincides with a central axis of a nano-scale pore and extends from a center of a bottom to an opening of the nano-scale pore is provided at the center of the bottom of the nano-scale pore. The nano-scale pillar has a diameter $2r_1$ of 10 nm to 950 nm and preferably 20 nm to 150 nm and a length $h_2$ of 10 nm to 9.9 μm and preferably 30 nm to 1.5 μm. A diameter ratio $r_1/r_2$ of the nano-scale pillar to a corresponding nano-scale pore is 0.1 to 0.9, a ratio $h_2/(h_1+h_2)$ of a length of the nano-scale pillar to a depth of a corresponding nano-scale pore is 0.15 to 0.95, and nano-scale pores with the nano-scale pillar account for 10% to 100% and preferably 30% to 90% of all nano-scale pores on the surface of the metal substrate. FIG. 3 and FIG. 4 show structures of a surface and a side of the metal substrate, respectively.

Example 1

In this example, a metal-resin composite was prepared with PPS based on the surface treatment of the present disclosure, including the following steps:

Step 1: Anodic Oxidation

1. An aluminum sheet that had undergone a conventional surface pretreatment was placed as a first anode in an electrolytic cell for polishing to obtain a first metal substrate, where an electrolyte was a mixed solution of perchloric acid and ethanol in a volume ratio of 1:4, and electrolysis was conducted at a constant voltage of 15 V for 5 min.

2. The first metal substrate was placed as a second anode in a 6 wt % $H_3PO_4$ solution, and electrolysis was conducted at a voltage of 40 V and a temperature of 0° C. for 2 h to obtain a second metal substrate.

3. The second metal substrate was soaked in a 5 wt % $H_3PO_4$ solution at 25° C. for 15 min, then rinsed with deionized water, and oven-dried to obtain a third metal substrate.

According to test results, a nano-scale pore array used for filling of a resin and vertically extending from a surface to an interior of the third metal substrate was formed on the surface of the third metal substrate, and a nano-scale pillar coinciding with a central axis of a nano-scale pore and extending from a center of a bottom to an opening of the nano-scale pore was provided at the bottom of the nano-scale pore. According to test results, the nano-scale pore had a depth of 470 nm and an average pore size of 74 nm; the nano-scale pillar had a length of 160 nm to 230 nm and a diameter of 51 nm; and the surface of the third metal substrate had a porosity of 0.298.

Step 2: Injection Molding

The third metal substrate was inserted into an injection molding mold; a temperature of the injection molding mold was set as 160° C., a temperature of a material barrel was set as 360° C., an injection molding pressure was set as 70 Mpa, and a pressure-holding time was set as 16 s; and a commercially-available Polyplastics' 1135ML PPS resin composition including a glass fiber was injected into the injection molding mold to obtain an initial metal-resin composite.

Step 3: Cooling

With the initial metal-resin composite retained in the injection molding mold, the injection molding mold was cooled in a room temperature (T=25° C.) environment, then cooled first at a cooling rate of 3.28*10$^{2°}$ C./s to 106° C., and then cooled at a cooling rate of 60.8° C./s to room temperature, and then demolding was conducted to obtain a composite of an aluminum alloy and PPS that were tightly bonded together. Five duplicable experiments were performed.

Comparative Example 1

In this comparative example, a metal-resin composite was prepared with PPS based on the existing surface treatment, including the following steps:

The steps 2 and 3 were the same as those in Example 1, except that a different metal surface treatment method was adopted in the step 1.

Step 1: Anodic Oxidation

1. An aluminum sheet that had undergone a conventional surface pretreatment was placed as a first anode in an electrolytic cell for polishing to obtain a first metal substrate, where an electrolyte was a mixed solution of perchloric acid and ethanol in a volume ratio of 1:4, and electrolysis was conducted at a constant voltage of 15 V for 5 min.

2. The first metal substrate was placed as a second anode in a 3.72 wt % oxalic acid solution, and electrolysis was conducted at a voltage of 60 V and a temperature of 10° C. for 9 min to obtain a second metal substrate.

3. The second metal substrate was soaked in a 5 wt % H$_3$PO$_4$ solution at 25° C. for 38 min, then rinsed with deionized water, and oven-dried to obtain a third metal substrate.

Figure 9:
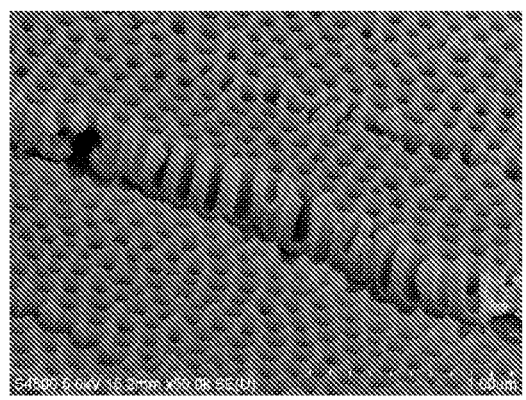
FIG. 9 shows a microporous structure of a surface of a metal manufactured in Comparative Example 1.

As shown in FIG. 9, pores extending from a surface to an interior of the third metal substrate were formed on the surface of the third metal substrate, and no nano-scale pillar was formed. The pores were consistent in a pore size, had an average pore size of 76 nm and a depth of 500 nm. The surface of the third metal substrate had a porosity of 0.309.

TABLE 1

Test data of shear strengths/MPa of samples in Example 1 and Comparative Example 1

| Sample No. | Example 1 | Comparative Example 1 |
|---|---|---|
| 1 | 19.173 | 9.117 |
| 2 | 19.749 | 8.939 |
| 3 | 20.003 | 9.482 |
| 4 | 19.535 | 10.002 |
| 5 | 18.652 | 8.075 |
| Average value | 19.422 | 9.123 |

Example 2

In this example, a metal-resin composite was prepared with PMMA based on the surface treatment of the present disclosure, including the following steps:

The steps 1 and 3 were the same as those in Example 1, except that a different resin was adopted in the step 2.

Step 2: Injection Molding

The third metal substrate was inserted into an injection molding mold; a temperature of the injection molding mold was set as 155° C., a temperature of a material barrel was set as 270° C., an injection molding pressure was set as 70 Mpa, and a pressure-holding time was set as 16 s; and commercially-available Macklin's injection-molding-grade PMMA was injected into the injection molding mold to obtain an initial metal-resin composite.

Comparative Example 2

In this comparative example, a metal-resin composite was prepared with PMMA based on the existing surface treatment, including the following steps:

The steps 2 and 3 were the same as those in Example 2, except that a different metal surface treatment method was adopted in the step 1.

Step 1: Anodic Oxidation

1. An aluminum sheet that had undergone a conventional surface pretreatment was placed as a first anode in an electrolytic cell for polishing to obtain a first metal substrate, where an electrolyte was a mixed solution of perchloric acid and ethanol in a volume ratio of 1:4, and electrolysis was conducted at a constant voltage of 15 V for 5 min.

2. The first metal substrate was placed as a second anode in a 3.72 wt % oxalic acid solution, and electrolysis was conducted at a voltage of 60 V and a temperature of 10° C. for 9 min to obtain a second metal substrate.

3. The second metal substrate was soaked in a 5 wt % H$_3$PO$_4$ solution at 25° C. for 38 min, then rinsed with deionized water, and oven-dried to obtain a third metal substrate.

According to test results, pores extending from a surface to an interior of the third metal substrate were formed on the surface of the third metal substrate, and no nano-scale pillar was formed. The pores were consistent in a pore size, had an average pore size of 76 nm and a depth of 500 nm. The surface of the third metal substrate had a porosity of 0.309.

TABLE 2

Test data of shear strengths/MPa of samples in Example 2 and Comparative Example 2

| Sample No. | Example 2 | Comparative Example 2 |
|---|---|---|
| 1 | 15.340 | 5.990 |
| 2 | 14.203 | 7.907 |
| 3 | 16.047 | 5.047 |
| 4 | 14.956 | 4.173 |
| 5 | 15.851 | 5.645 |
| Average value | 15.279 | 5.752 |

It can be seen from Table 2 that a bonding force of the PMMA to the aluminum alloy in the composite prepared based on the surface treatment in the present disclosure can reach 15.279 MPa after the composite is cooled in a room temperature environment, and is improved by 266% compared with a strength of a metal-resin composite prepared without the surface treatment in the present disclosure, and there is very excellent repeatability and a very low defective rate, which greatly expands a range of NMT resins.

Example 3

In this example, a metal-resin composite was prepared with PMMA based on the surface treatment of the present disclosure and the cooling mode in this example, including the following steps:

The steps 1 and 2 were the same as those in Example 2, except that a different cooling mode was adopted in the step 3.

Step 3: Cooling

With the initial metal-resin composite retained in the injection molding mold, the injection molding mold was cooled in liquid nitrogen, then cooled at a cooling rate of $4.73*10^3$° C./s to −196° C., and then warmed to room temperature, and then demolding was conducted to obtain a composite of an aluminum alloy and PMMA that were tightly bonded together. The above preparation process was repeated 5 times.

Comparative Example 3

In this comparative example, a metal-resin composite was prepared with PMMA based on the existing surface treatment and a cooling mode, including the following steps:

The steps 2 and 3 were the same as those in Example 3, except that a different metal surface treatment method was adopted in the step 1.

Step 1: Anodic Oxidation

1. An aluminum sheet that had undergone a conventional surface pretreatment was placed as a first anode in an electrolytic cell for polishing to obtain a first metal substrate, where an electrolyte was a mixed solution of perchloric acid and ethanol in a volume ratio of 1:4, and electrolysis was conducted at a constant voltage of 15 V for 5 min.

2. The first metal substrate was placed as a second anode in a 3.72 wt % oxalic acid solution, and electrolysis was conducted at a voltage of 60 V and a temperature of 10° C. for 9 min to obtain a second metal substrate.

3. The second metal substrate was soaked in a 5 wt % $H_3PO_4$ solution at 25° C. for 38 min, then rinsed with deionized water, and oven-dried to obtain a third metal substrate.

According to test results, pores extending from a surface to an interior of the third metal substrate were formed on the surface of the third metal substrate, and no nano-scale pillar was formed. The pores were consistent in a pore size, had an average pore size of 76 nm and a depth of 500 nm. The surface of the third metal substrate had a porosity of 0.309.

TABLE 3

Test data of shear strengths/MPa of samples in Example 3 and Comparative Example 3

| Sample No. | Example 3 | Comparative Example 3 |
|---|---|---|
| 1 | 19.437 | 0.400 |
| 2 | 19.784 | 0 |
| 3 | 20.739 | 0.276 |
| 4 | 18.590 | 0.107 |
| 5 | 21.492 | 0.338 |
| Average value | 20.008 | 0.224 |

A bonding force of the PMMA to the aluminum alloy in the composite prepared by the method of the present disclosure at a cooling rate of $4.73*10^3$° C./s can reach 20.008 MPa, which reaches an industrial application standard and is improved by 89 or more times compared with a strength of a metal-resin composite including ordinary nano-scale round pores with a same depth and porosity.

The method of the present disclosure solves the problem that a too-high cooling rate causes a decline of an interfacial bonding strength of a composite during a manufacturing process due to a huge difference in a coefficient of thermal expansion between a metal and a resin.

Example 4

In this example, an aluminum alloy-resin composite was prepared with PMMA based on the surface treatment of the present disclosure.

The steps 1 and 2 were the same as those in Example 2, except that a different cooling mode was adopted in the step 3.

Step 3: Cooling

With the initial metal-resin composite retained in the injection molding mold, the injection molding mold was immediately placed in a 155° C. oven, then cooled at a cooling rate of 67.1° C./s to 105° C., and then naturally cooled to room temperature, and then demolding was conducted to obtain a composite of an aluminum alloy and PMMA that were tightly bonded together. The above preparation process was repeated 5 times.

Comparative Example 4

In this comparative example, a metal-resin composite was prepared with PMMA based on the existing surface treatment and a cooling mode, including the following steps:

The steps 2 and 3 were the same as those in Example 4, except that a different metal surface treatment method was adopted in the step 1.

Step 1: Anodic Oxidation

1. An aluminum sheet that had undergone a conventional surface pretreatment was placed as a first anode in an electrolytic cell for polishing to obtain a first metal substrate, where an electrolyte was a mixed solution of perchloric acid and ethanol in a volume ratio of 1:4, and electrolysis was conducted at a constant voltage of 15 V for 5 min.

2. The first metal substrate was placed as a second anode in a 3.72 wt % oxalic acid solution, and electrolysis was conducted at a voltage of 60 V and a temperature of 10° C. for 9 min to obtain a second metal substrate.

3. The second metal substrate was soaked in a 5 wt % $H_3PO_4$ solution at 25° C. for 38 min, then rinsed with deionized water, and oven-dried to obtain a third metal substrate.

According to test results, pores extending from a surface to an interior of the third metal substrate were formed on the surface of the third metal substrate, and no nano-scale pillar was formed. The pores were consistent in a pore size, had an average pore size of 76 nm and a depth of 500 nm. The surface of the third metal substrate had a porosity of 0.309.

TABLE 4

Test data of shear strengths/MPa of samples in Example 4 and Comparative Example 4

| Sample No. | Example 4 | Comparative Example 4 |
|---|---|---|
| 1 | 12.880 | 9.653 |
| 2 | 12.946 | 7.414 |
| 3 | 13.031 | 8.516 |

TABLE 4-continued

Test data of shear strengths/MPa of samples
in Example 4 and Comparative Example 4

| Sample No. | Example 4 | Comparative Example 4 |
|---|---|---|
| 4 | 12.336 | 8.438 |
| 5 | 13.563 | 9.339 |
| Average value | 12.951 | 8.672 |

Example 5

In this example, an aluminum alloy/resin composite was prepared with PMMA based on the surface treatment of the present disclosure. Example 5 was different from Example 3 merely in that a prepared metal-resin composite was subjected to a high-temperature/low-temperature cycle test according to the national standard GB/T 2423.22-2012.

Comparative Example 5

In this comparative example, a metal-resin composite was prepared with PMMA based on the existing surface treatment and a cooling mode, including the following steps: Comparative Example 5 was different from Comparative Example 4 merely in that a prepared metal-resin composite was subjected to a high-temperature/low-temperature cycle test, and subjected to a selection test according to the national standard GB/T 2423.22-2012 to evaluate whether the material combination was tolerant to a rapid temperature change. Test parameters: a laboratory ambient temperature: 25° C., a low temperature TA: −30° C., a high temperature TB: 50° C., an exposure duration $t_1$: 3,720 s, a conversion time $t_2$: 10 s, and a sample stabilization time $t_s$: 120 s.

Step 1: Anodic Oxidation

1. An aluminum sheet that had undergone a conventional surface pretreatment was placed as a first anode in an electrolytic cell for polishing to obtain a first metal substrate, where an electrolyte was a mixed solution of perchloric acid and ethanol in a volume ratio of 1:4, and electrolysis was conducted at a constant voltage of 15 V for 5 min.

2. The first metal substrate was placed as a second anode in a 3.72 wt % oxalic acid solution, and electrolysis was conducted at a voltage of 60 V and a temperature of 10° C. for 9 min to obtain a second metal substrate.

3. The second metal substrate was soaked in a 5 wt % $H_3PO_4$ solution at 25° C. for 38 min, then rinsed with deionized water, and oven-dried to obtain a third metal substrate.

According to test results, pores extending from a surface to an interior of the third metal substrate were formed on the surface of the third metal substrate. The pores were consistent in a pore size, hade an average pore size of 76 nm and a depth of 500 nm. The surface of the third metal substrate had a porosity of 0.309.

TABLE 5

Test data of shear strengths/MPa of samples
in Example 5 and Comparative Example 5

| Sample No. | Example 3 | Example 5 | Comparative Example 4 | Comparative Example 5 |
|---|---|---|---|---|
| 1 | 19.437 | 18.69 | 9.653 | 5.151 |
| 2 | 19.784 | 18.646 | 7.414 | 4.143 |
| 3 | 20.739 | 18.005 | 8.516 | 5.378 |
| 4 | 18.590 | 19.570 | 8.438 | 6.006 |
| 5 | 21.492 | 19.162 | 9.339 | 5.008 |
| Average value | 20.008 | 18.815 | 8.672 | 5.137 |

After a high-temperature/low-temperature cycle test, a bonding strength of a "pillar in pore" sample decreased by 5.962%, and a bonding strength of an ordinary nano-scale round pore sample decreased by 40.763%.

Figure 6:
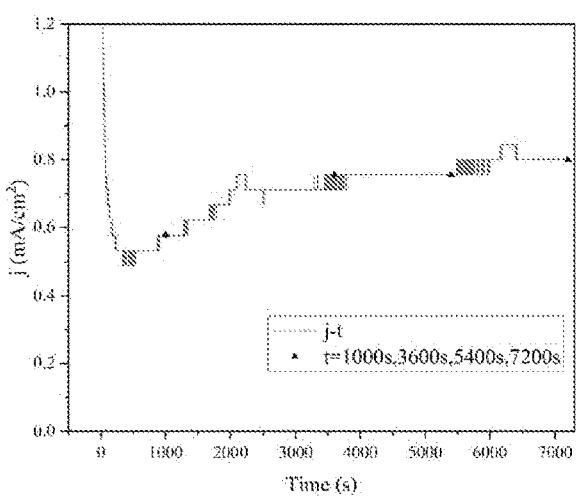
FIG. 6 shows a change of a current density over time in Example 7.
Figure 7A:
FIGS. 7A-D shows SEM images of concave alumina pore structure arrays with nano-scale pillars formed with different oxidation times in Example 7, where A shows an array formed with an oxidation time of 1,000 s, B shows an array formed with an oxidation time of 3,600 s, C shows an array formed with an oxidation time of 5,400 s, and D shows an array formed with an oxidation time of 7,200 s.
Figure 7B:
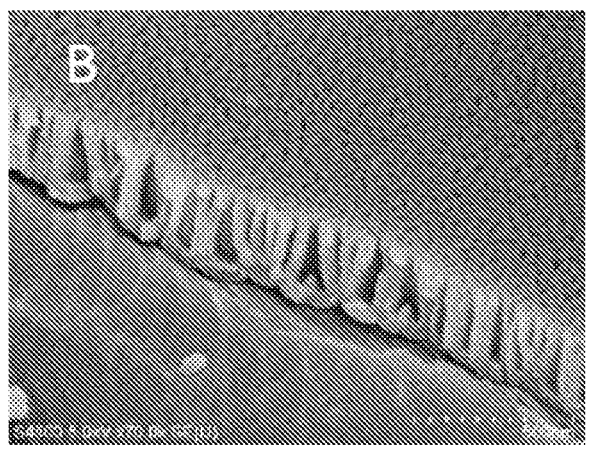
Figure 7C:
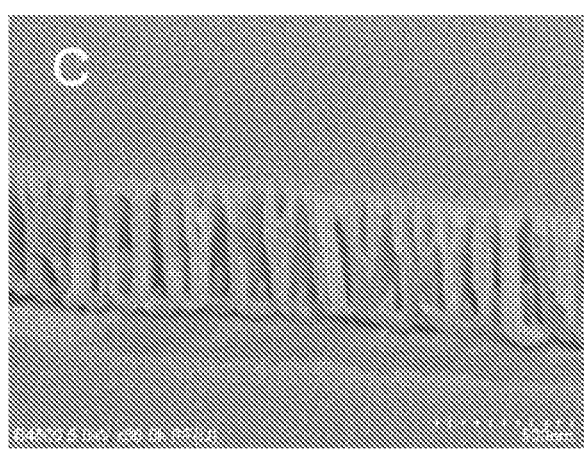
Figure 7D:
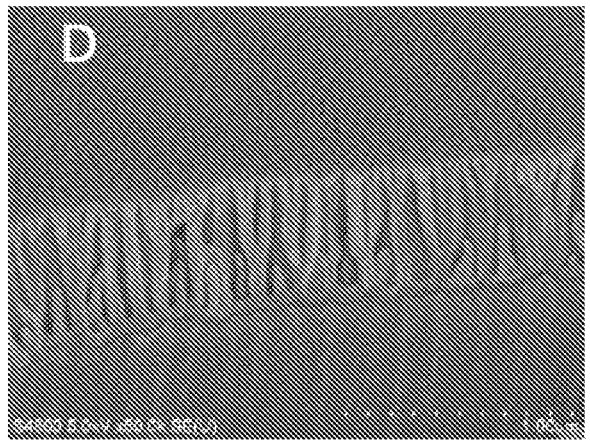

Example 6 Investigation of Influencing Factors (1) Investigation of an Electrochemical Anodic Oxidation Time Aluminum was subjected to electrochemical anodic oxidation at a voltage of 40 V and a temperature of 0° C. with a 6 wt % phosphoric acid solution as an electrolyte for different times (1,000 s, 3,600s, 5,400 s, and 7,200 s) to manufacture concave alumina pore structure arrays with nano-scale pillars, respectively. A change of a current density over time is shown in FIG. 6, and SEM images are shown in FIGS. 7A-D. According to the results, when an oxidation time is 1,000 s, a pore depth is 52.74 nm; when an oxidation time is 3,600 s, a pore depth is 209.16 nm and a pillar length is 43.49 nm; when an oxidation time is 5,400 s, a pore depth is 412.81 nm and a pillar length is 109.20 nm; and when an oxidation time is 7,200 s, a pore depth is 477.43 nm and a pillar length is 182.46 nm. It can be seen that, when a depth of a pore is small (that is, a length-to-diameter ratio of the pore is relatively small) at an early stage of anodic oxidation, a "pillar in pore" structure is not formed, and only when a specified length-to-diameter ratio is reached, freshly-produced aluminum hydroxide colloids cannot all diffuse and migrate outside of pores in time, and thus a "pillar in pore" structure will be formed.

(2) Influence of Pore Expansion

Figure 8A:
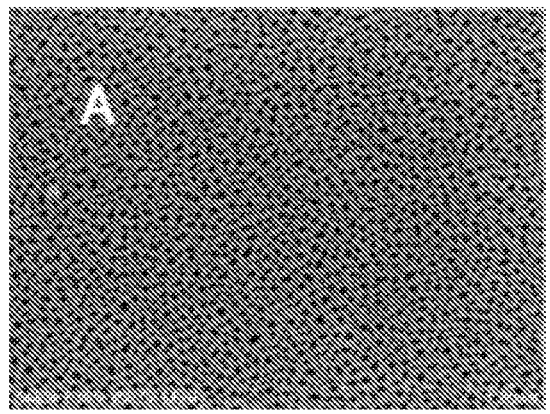
FIGS. 8A-B shows SEM images of a metal before and after pore expansion in Example 7, where A is an SEM image of the metal before pore expansion and B is an SEM image of the metal after pore expansion.
Figure 8B:
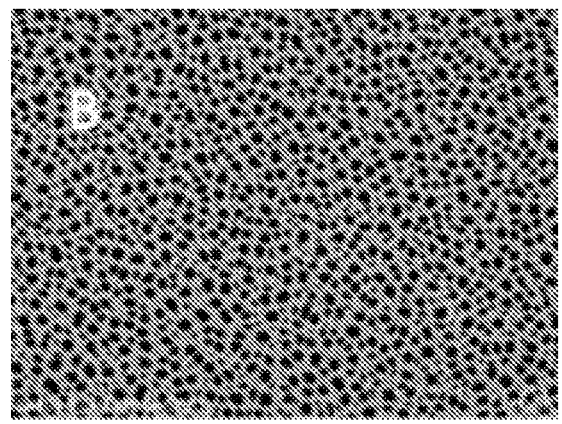

FIGS. 8A-B shows SEM images of a metal before and after pore expansion. It can be seen that the pore expansion step is intended to remove residual alumina on a surface of a nano-pore array, and also has the effects of expanding a pore size and improving a porosity.

What is claimed is:

1. A surface-treated metal for metal-resin bonding, wherein a nano-scale pore array for filling of a resin is provided to extend from a surface to an interior of a metal, and nano-scale pillars are provided to extend from bottoms to openings of some or all of nano-scale pores of the nano-scale pore array;
the nano-scale pores each have a depth of 20 nm to 10 μm and a pore size of 20 nm to 1 μm;
the nano-scale pillars each have a length of 10 nm to 9.9 μm and a diameter of 20 nm to 950 nm;
the surface of the metal has a porosity of 0.1 to 0.9;
the nano-scale pillars have a same chemical composition as walls of the nano-scale pores; a material for the walls of the nano-scale pores is a metal oxide;

an included angle between a central axis of each of the nano-scale pores and the surface of the metal is 60° to 90°; an included angle between each of the nano-scale pillars and a central axis of a corresponding nano-scale pore is 0° to 30°;

the nano-scale pores provided with the nano-scale pillars account for 10% to 100% of all the nano-scale pores on the surface of the metal; and the metal is selected from a group consisting of aluminum, magnesium, copper, titanium, iron, zinc, and an alloy thereof; and the resin is selected from a group consisting of a thermoplastic resin and a thermosetting resin.

2. The surface-treated metal for metal-resin bonding according to claim 1, wherein a diameter ratio of the nano-scale pillars to the nano-scale pores is 0.1 to 0.9, and a ratio of the length of the nano-scale pillars to the depth of the nano-scale pores is 0.15 to 0.95.

3. A metal-resin composite, comprising the surface-treated metal for metal-resin bonding according to claim 1 and a resin located on the surface and filled in the nano-scale pores in the nano-scale pore array of the metal, wherein the resin is a single resin or a resin composition; and the resin comprises a host resin, and comprises or does not comprise a reinforcing material.

4. A substrate of a printed circuit board for high-frequency and high-speed signal transmission, comprising the metal-resin composite according to claim 3.

5. A manufacturing method of a surface-treated metal for metal-resin bonding, wherein the metal is aluminum or an aluminum alloy, wherein a nano-scale pore array for filling of a resin is provided to extend from a surface to an interior of a metal, and nano-scale pillars are provided to extend from bottoms to openings of at least one of nano-scale pores of the nano-scale pore array;

the nano-scale pores each have a depth of 20 nm to 10 μm and a pore size of 20 nm to 1 μm;

the nano-scale pillars each have a length of 10 nm to 9.9 um and a diameter of 20 nm to 950nm;

the surface of the metal has a porosity of 0.1 to 0.9;

the nano-scale pillars have a same chemical composition as walls of the nano-scale pores; a material for the walls of the nano-scale pores is a metal oxide;

an included angle between a central axis of each of the nano-scale pores and the surface of the metal is 60° to 90°; an included angle between each of the nano-scale pillars and a central axis of a corresponding nano-scale pore is 0° to 30°;

the nano-scale pores provided with the nano-scale pillars account for 10% to 100% of all the nano-scale pores on the surface of the metal; and the metal is selected from a group consisting of aluminum, magnesium, copper, titanium, iron, zinc, and an alloy thereof; and the resin is selected from a group consisting of a thermoplastic resin and a thermosetting resin, wherein the manufacturing method comprises the following steps:

S1: cleaning a surface of an original metal to obtain a first metal intermediate, and placing the first metal intermediate as a first anode in an electrolytic cell for polishing to obtain a second metal intermediate;

S2: placing the second metal intermediate as a second anode in a first acidic solution, and conducting anodic oxidation at a voltage of 10 V to 100 V and a temperature of −10° C. to 30° C. for 3 min to 300 min to obtain a third metal intermediate, wherein the first acidic solution comprises 0.1 wt % to 25 wt % of one or more acids selected from a group consisting of sulfuric acid, phosphoric acid, oxalic acid, chromic acid, boric acid, benzoic acid, citric acid, and tartaric acid, and a solvent of the first acidic solution is pure water or a water-ethylene glycol mixed solvent comprising 0.1 wt % to 80 wt % of ethylene glycol; and a current density for the anodic oxidation is less than 1.5 mA/cm2;

S3: soaking the third metal intermediate in a second acidic solution 1 time to 20 times for 1 min to 90 min each time to allow pore expansion to obtain a fourth metal intermediate, wherein the second acidic solution comprises 0.1 wt % to 25 wt % of one or more acids selected from the group consisting of sulfuric acid, phosphoric acid, oxalic acid, chromic acid, boric acid, benzoic acid, citric acid, and tartaric acid, and has a strong acidity, but exhibits a weak dissolution-oxidation ability for a metal oxide; a temperature of the second acidic solution is maintained at 0° C. to 100° C.; and a metal product obtained after the soaking each time is washed with water and then blow-dried with cold air; and S4: rinsing and oven-drying the fourth metal intermediate.

6. A metal-resin composite, comprising the surface-treated metal for metal-resin bonding according to claim 2 and a resin located on the surface and filled in the nano-scale pores in the nano-scale pore array of the metal, wherein the resin is a single resin or a resin composition; and the resin comprises a host resin, and comprises or does not comprise a reinforcing material.

7. The manufacturing method of the surface-treated metal for metal-resin bonding according to claim 5, wherein after the S1 and before the S2, the manufacturing method further comprises the following steps sequentially:

S2-0: placing the second metal intermediate as a third anode in a third acidic solution, and conducting anodic pre-oxidation at a voltage of 30 V to 80 V and a temperature of 0° C. to 50° C. for 10 min to 60 min to obtain a fifth metal intermediate, wherein the third acidic solution comprises 0.1 wt % to 25 wt % of one or more acids selected from the group consisting of sulfuric acid, phosphoric acid, oxalic acid, chromic acid, boric acid, benzoic acid, citric acid, and tartaric acid, and a solvent of the third acidic solution is pure water or a water-ethylene glycol mixed solvent comprising 0.1 wt % to 80 wt % of ethylene glycol; and S2-1: soaking the fifth metal intermediate in a mixed acid solution 1 to 20 times for 1 min to 3 min each time to partially or completely remove a porous alumina layer formed after the anodic pre-oxidation, wherein the mixed acid solution comprises 1 wt % to 10 wt % of chromic acid and 5 wt % to 60 wt % of phosphoric acid; a temperature of the mixed acid solution is maintained at 10° C. to 100° C.; and a metal product obtained after the soaking each time is washed with water and then blow-dried with cold air.

8. A manufacturing method of the metal-resin composite according to claim 3, comprising the following steps:

S1: pretreating a surface of a metal to form a nano-scale pore structure for injection molding on the surface of the metal to obtain the surface-treated metal;

S2: placing the surface-treated metal in a mold, setting a temperature of the mold to be higher than a glass transition temperature of the resin and lower than a melting temperature of the resin, and injecting the resin into the mold such that the resin is bonded with the surface-treated metal to produce an initial metal-resin composite, wherein a pressure-holding time is 5 s to 20 s; and S3: allowing the initial metal-resin composite in the mold to be cooled at a cooling rate of higher than 100° C./s from an original temperature to a final temperature 20° C. lower than the glass transition temperature of the resin, and demolding.

* * * * *